United States Patent
Pruneri et al.

(10) Patent No.: US 12,080,993 B2
(45) Date of Patent: Sep. 3, 2024

(54) METHOD FOR PHYSICAL RANDOM NUMBER GENERATION USING A VERTICAL CAVITY SURFACE EMITTING LASER

(71) Applicants: FUNDACIÓ INSTITUT DE CIÉNCIES FOTÓNIQUES, Barcelona (ES); 03;Institució Catalana de Recerca I Estudis Avancats, Barcelona (ES)

(72) Inventors: Valerio Pruneri, Bacelona (ES); Carlos Abellan Sanchez, Bacelona (ES); Waldimar Amaya, Bacelona (ES); Morgan Mitchell, Bacelona (ES)

(73) Assignees: FUNDACIÓ INSTITUT DE CIENCIES FOTÓNIQUES, Barcelona (ES); Institució Catalana de Recerca I Estudis Avancats, Barcelona (ES)

( * ) Notice: Subject to any disclaimer, the term of this patent is extended or adjusted under 35 U.S.C. 154(b) by 0 days.

(21) Appl. No.: 18/183,395

(22) Filed: Mar. 14, 2023

(65) Prior Publication Data

US 2023/0291174 A1  Sep. 14, 2023

Related U.S. Application Data

(63) Continuation of application No. 16/761,995, filed as application No. PCT/ES2017/070734 on Nov. 6, 2017, now Pat. No. 11,631,964.

(51) Int. Cl.
*H01S 5/00* (2006.01)
*H01S 5/042* (2006.01)
(Continued)

(52) U.S. Cl.
CPC ........ *H01S 5/0427* (2013.01); *H01S 5/06213* (2013.01); *H01S 5/06226* (2013.01);
(Continued)

(58) Field of Classification Search
CPC .............. H01S 5/06213; H01S 5/0623; H01S 5/06812; H01S 5/0264; H01S 5/0427; H01S 5/06226; H01S 5/183
See application file for complete search history.

(56) References Cited

U.S. PATENT DOCUMENTS 9,218,160 B2  12/2015  Pruneri et al.
9,710,230 B2   7/2017  Pruneri et al.
(Continued)

FOREIGN PATENT DOCUMENTS

CN    106301754    1/2017

OTHER PUBLICATIONS

Mulet Pol, Josep, "Polarization and Intensity Noise in Vertical-Cavity Surface-Emmitting Lasers", University of the Balearic Island, Physics Dept (Oct. 2001).
(Continued)

*Primary Examiner* — Kinam Park
(74) *Attorney, Agent, or Firm* — Edell, Shapiro & Finnan, LLC

(57) ABSTRACT

A method for physical random number generation includes the steps of: modulating the gain of a vertical-cavity surface-emitting laser periodically from the lower threshold to the upper threshold and back; maintaining the gain per round trip positive for a longer period than the round trip time of the cavity; maintaining the net gain per round trip negative for a longer period than the round trip time of the cavity, in order to create optical pulses of random amplitude; detecting the optical pulses; converting the optical pulses into electrical analog pulses; and digitising the electrical analog pulses into random numbers.

11 Claims, 5 Drawing Sheets

(51) Int. Cl.
    *H01S 5/062*     (2006.01)
    *H01S 5/068*     (2006.01)
    *G06F 7/58*     (2006.01)
    *H01S 5/026*     (2006.01)
    *H01S 5/183*     (2006.01)

(52) U.S. Cl.
    CPC ........ H01S 5/0623 (2013.01); H01S 5/06812 (2013.01); *G06F 7/588* (2013.01); *H01S 5/0264* (2013.01); *H01S 5/183* (2013.01)

(56) References Cited

U.S. PATENT DOCUMENTS

| | | | | |
|---|---|---|---|---|
| 2002/0064193 A1* | 5/2002 | Diaz | ........ | H01S 5/042 372/26 |
| 2008/0292102 A1* | 11/2008 | Wang | ........ | H04L 9/0852 380/256 |
| 2013/0036145 A1* | 2/2013 | Pruneri | ........ | G06F 7/588 708/250 |
| 2015/0331672 A1* | 11/2015 | Yuan | ........ | H04L 9/0852 359/107 |
| 2017/0115960 A1* | 4/2017 | Pruneri | ........ | H01S 5/065 |
| 2019/0393675 A1* | 12/2019 | Marangon | ........ | G01J 11/00 |
| 2020/0301669 A1* | 9/2020 | Paraiso | ........ | H01S 5/4006 |

OTHER PUBLICATIONS

International Search Report and Written Opinion of the International Searching Authority from corresponding PCT Application No. PCT/ES2017/070734, Jul. 12, 2018.

Abbas Khanmohannadi et al., "A Laser Diode Driver with Hiperbolic time Dependent current in 0.35 um BiCMOS Technology", 2015 Austrian Workshop on Microelectronics, pp. 21-26, IEEE Computer Society, Sep. 28, 2015.

\* cited by examiner

METHOD FOR PHYSICAL RANDOM NUMBER GENERATION USING A VERTICAL CAVITY SURFACE EMITTING LASER

CROSS REFERENCE TO RELATED APPLICATIONS

This application is a continuation of U.S. patent application Ser. No. 16/761,995, filed May 6, 2020, which is a § 371 national stage of International Application PCT/ES2017/070734, filed Nov. 6, 2017, which is hereby incorporated herein by reference in its entirety.

FIELD OF THE INVENTION

The present invention relates to random number generators (RNGs), in particular to generators based on the random dynamics observed in gain-switched laser cavities.

BACKGROUND OF THE INVENTION

Random numbers are by definition unpredictable, and a sequence of random numbers shows no predictable patterns. A random number generator (RNG) is a computational or physical device designed to generate random numbers. RNGs can be classified in pseudo-RNGs (PRNGs), which are computational algorithms, and true-RNGs (TRNGs), which are based on random dynamics in physical systems.

Current commercial RNG devices are based on the spatial distribution of single photons, chaotic dynamics in semiconductor lasers, CMOS metastability, single photon detection in arrays of single photon detectors, and phase diffusion in semiconductor lasers among many other schemes.

U.S. patent application Publication No. 2013/0036145 A1 discloses a TRNG based on measuring quantum phase diffusion in a pulsed single-mode semiconductor laser. By modulating the laser from below to above threshold, optical pulses with nearly identical intensities and completely randomized phases are generated. Then, by using an external interferometer, the random phases are translated into random amplitudes, which can be digitised with a proper detector. Instead of one laser source and an interferometer, two laser sources can be used together with a combiner. The technique allows for ultrafast operation regimes, and recent publications have shown bitrates of 40-80 Gbps. However, the need for an external interferometric element or two lasers that are spectrally matched in emission and coupling optics complicates the layout as it increases the number of elements, and the overall dimension of the device. For example, in the case of the two lasers their emission wavelength spectra have to be narrow (single mode), matched and maintained over time and this is not always easy to achieve due to intrinsic instability and environmental changes.

Commonly-owned U.S. patent application Publication No. 2017/0115960 A1 discloses a QRNG based on measuring quantum phase diffusion in a pulsed multimode-mode semiconductor laser. In this scheme, the beating of two or more laser modes of the cavity produces a random signal oscillating at a frequency equal to the difference in the laser modes frequencies. Contrary to the single-mode case described above, this scheme does not require the use of an external interferometer or two lasers. However, multimode lasers might suffer from mode instability and it is not always easy to find a design that allows a sufficiently low frequency beating signal to be detected with inexpensive electronics.

Modulation of the current from below to above threshold has been proposed in single mode lasers, as it was mentioned above (US2013/0036145 A). However in these devices, generation of random patterns and random numbers implied interference, with the complexity that this entails.

SUMMARY OF THE INVENTION

The present invention provides a method for physical random number generation with reduced dimensions (footprint), high stability, that maintains the high speed and high quality. The invention is based on the random gain of a single mode vertical-cavity surface-emitting laser (VCSEL) which produces pulses of differing amplitude (intensity) when its current is modulated from below to above threshold. The random intensity patterns can subsequently be detected with a photodiode. In the process of the invention, not only the phase of the mode, but also the gain varies from pulse to pulse. In this way, to produce random intensities patterns, i.e. random numbers, an external interferometer or beating with another reference laser is not necessary, making the proposed scheme easier to implement, more compact and robust.

For this purpose, one form of the invention comprises the steps of utilizing a VCSEL whose gain is modulated periodically from below threshold to above threshold and back, maintaining gain per round trip positive for a longer period than the round trip time of the cavity and maintaining net gain per round trip negative for a longer period than the round trip time of the cavity, to create pulses of random amplitude. The pulses are detected by utilizing, for example, a fast photodiode (PIN). The means for modulating gain, from below threshold to above threshold and back, can be for example an electrical pulse driver.

These and other objects, advantages and features of the invention will become apparent upon review of the following specification in conjunction with the drawings.

DETAILED DESCRIPTION

Figure 1:
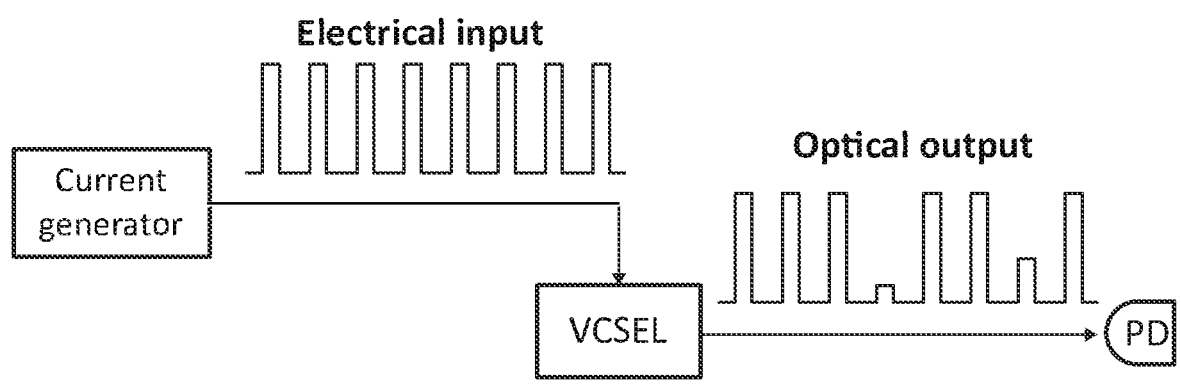
FIG. 1 shows a scheme of the method of the invention.

There are different VCSEL structures for implementing embodiments of the invention. The driving current applied to the VCSEL to modulate its gain consists of two parts: a bias current and a modulating current. It is essential that the sum of those (i.e. the total current applied) take the VCSEL from below (regime of spontaneous emission) to above threshold (regime of stimulated emission) and back continuously. FIG. 1 shows a possible scheme for implementing the process of the invention. A generator (electrical pulse driver) delivers current pulses to a VCSEL that produce a train of optical pulses with varying amplitude that can be detected by a photodiode (PD). When the VCSEL is taken from below to above threshold and back again at each pulse, the intensity pattern becomes random and can be digitised into a random number sequence.

Figure 2:
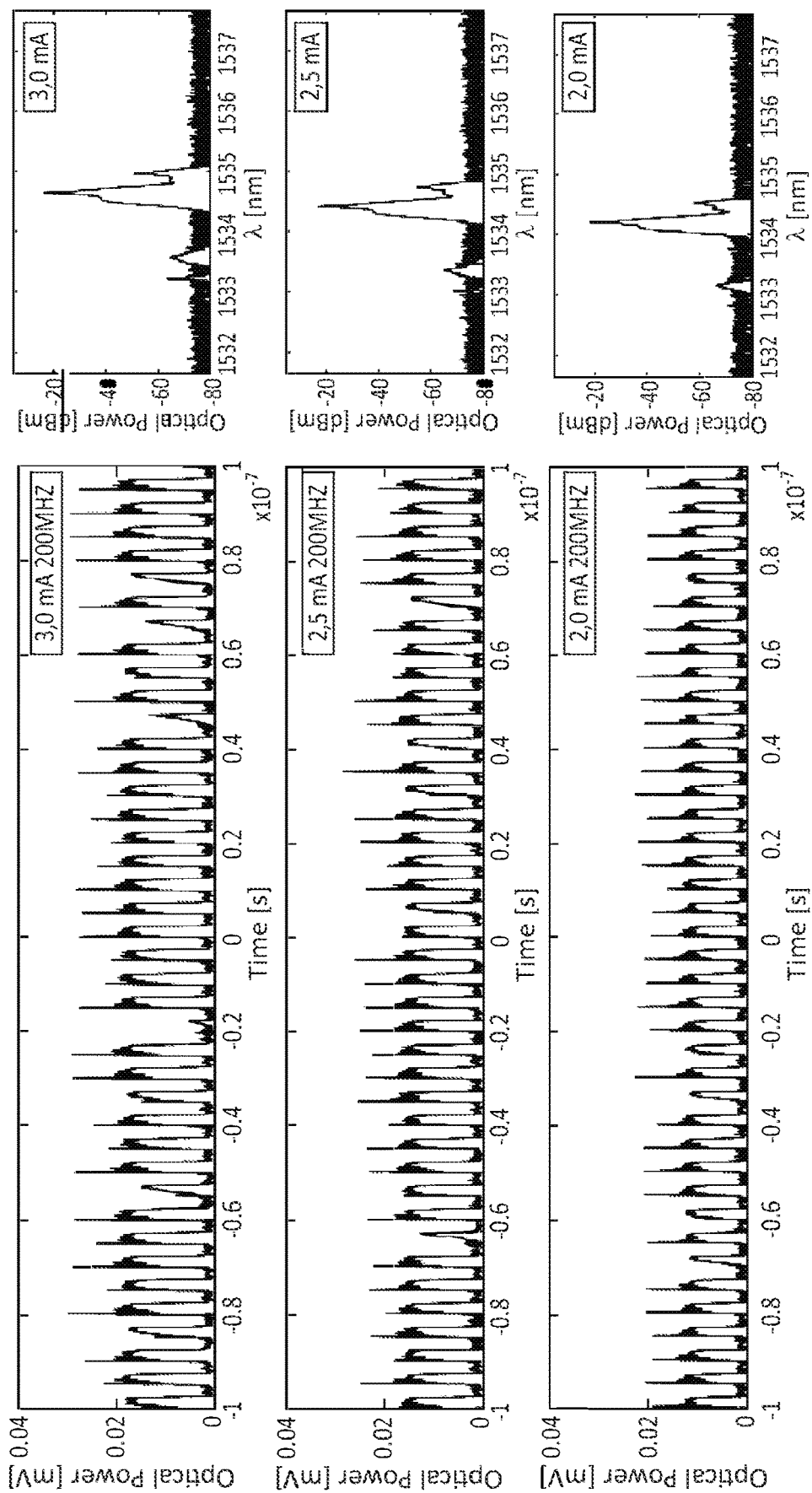
FIG. 2 shows the time dependent traces (left) and corresponding spectra (right) of train pulses as in the method of the invention.

FIG. 2 shows an example of the train of pulses (intensity as a function of time) detected by the photodiode and displayed by an oscilloscope, together with the corresponding spectra (intensity as a function of wavelength). On the left, the time dependent traces can be seen, while on the right, the corresponding spectra of a train of pulses with varying amplitude at different bias currents, 2, 2.5 and 3 mA (pulse/modulation frequency 200 MHz) can be found. The modulating current varies from about −2 mA to +2 mA. Under these conditions, the VCSEL goes from below-to-above—to-below threshold during the formation of each pulse. Despite a periodic modulation of the current (always with the same value from pulse to pulse), the optical intensity of the pulses varies. In some instances, the optical pulses reach their maximum amplitude right after the current is taken to above threshold while in other cases it takes a while before the pulses reach their maximum intensity. In other instances, the pulses are essentially absent (they do not grow). In this way, a train of pulses with random intensity is generated, which can be subsequently detected and digitised into random numbers.

Figure 3:
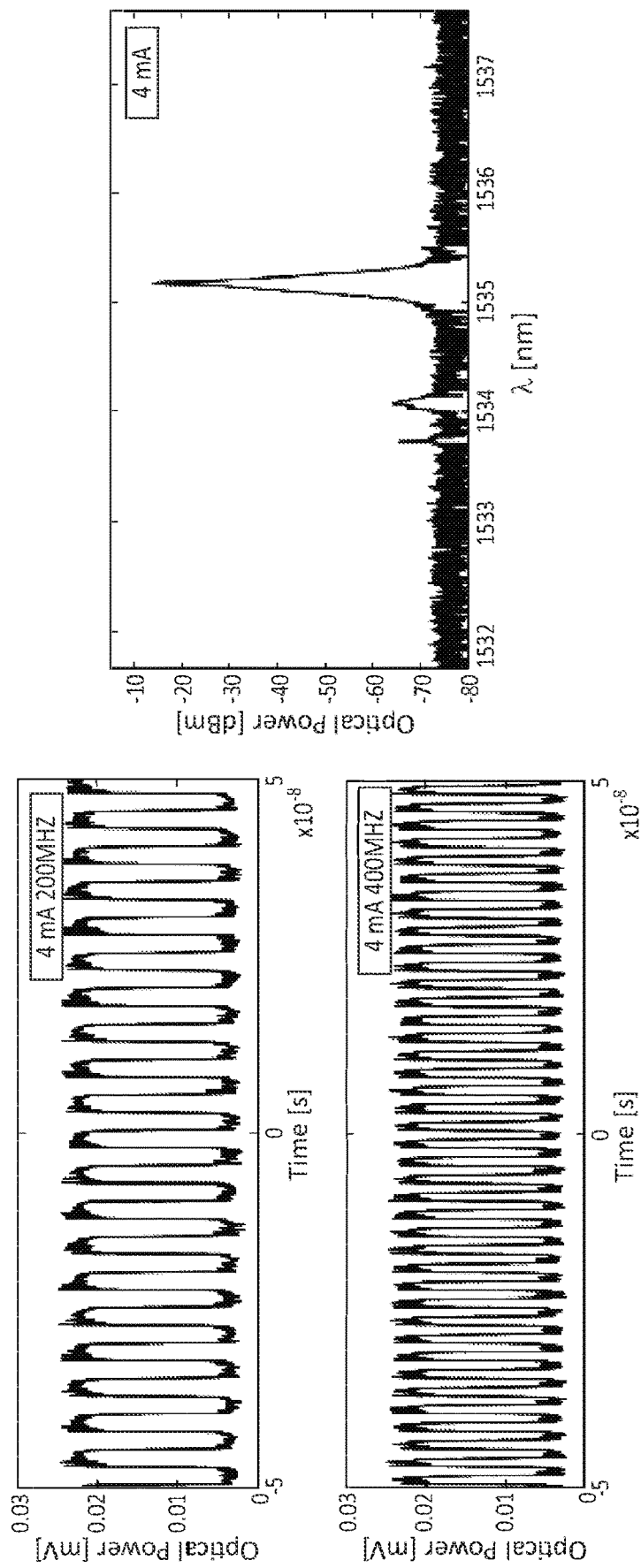
FIG. 3 represents the time-dependent trace (left) and spectrum (right) of a train of pulses for a VCSEL that stays always above threshold in contrast with FIG. 2.

FIG. 3 clearly shows that in the case the VCSEL current is not taken below threshold, i.e. the current is modulated from slightly above threshold to farther above threshold, the intensity of the different optical pulses does not change over time. The time dependent trace (left) and corresponding spectrum (right) of a train of pulses with constant amplitude and different pulse/modulation frequency, for a bias current of 4 mA is shown. The modulating current varies from about −2 mA to +2 mA. Under these conditions, the VCSEL stays always above threshold. There is also a clear difference between corresponding spectra (FIGS. 2 and 3 bottom): in the case of random intensity patterns there exists a side lobe at long wavelength, which is essentially absent in the case of constant intensity patterns. Such a side lobe indicates that when the modulation brings the laser from below to above the threshold level, a new mode is generated. For certain pulses, the gain experienced by the predominant mode is reduced, with its consequent smaller growth, while it is larger for the side mode. The fact that the gain for the predominant mode is reduced in the pulses with lower intensity is also in agreement with the absence of the relaxation oscillation peaks at the beginning of each pulse.

Figure 4:
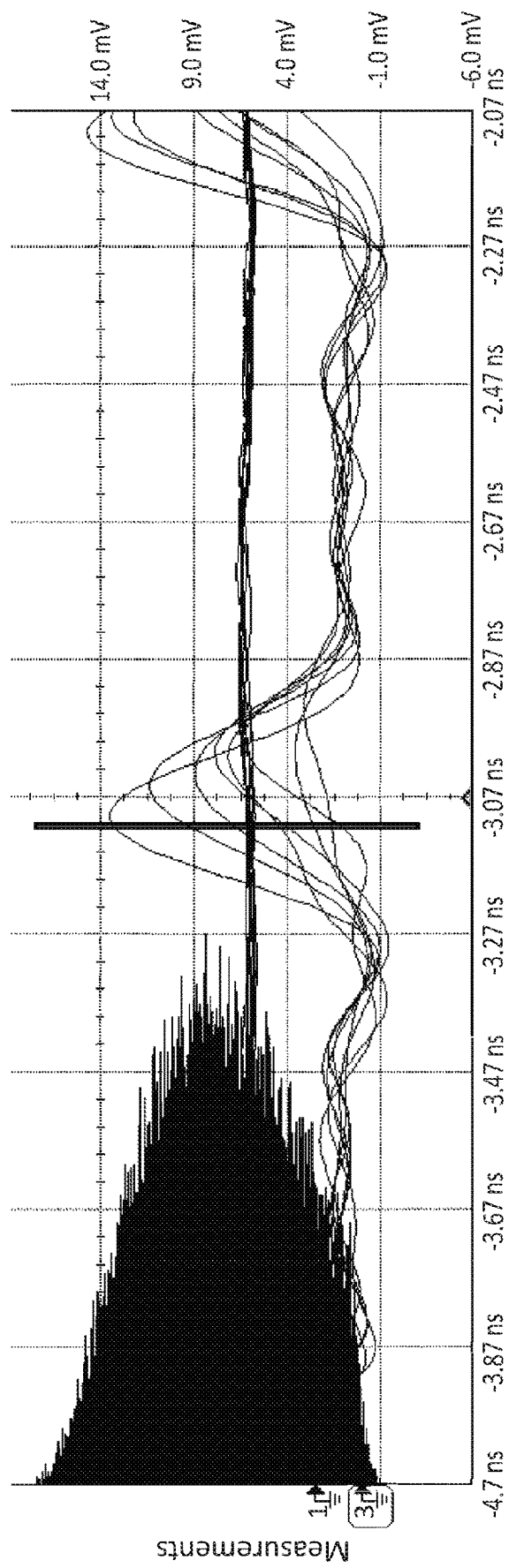
FIG. 4 shows the time dependent trace of several pulses (right) captured by an oscilloscope together with their statistical distribution of intensity (left)
Figure 5:
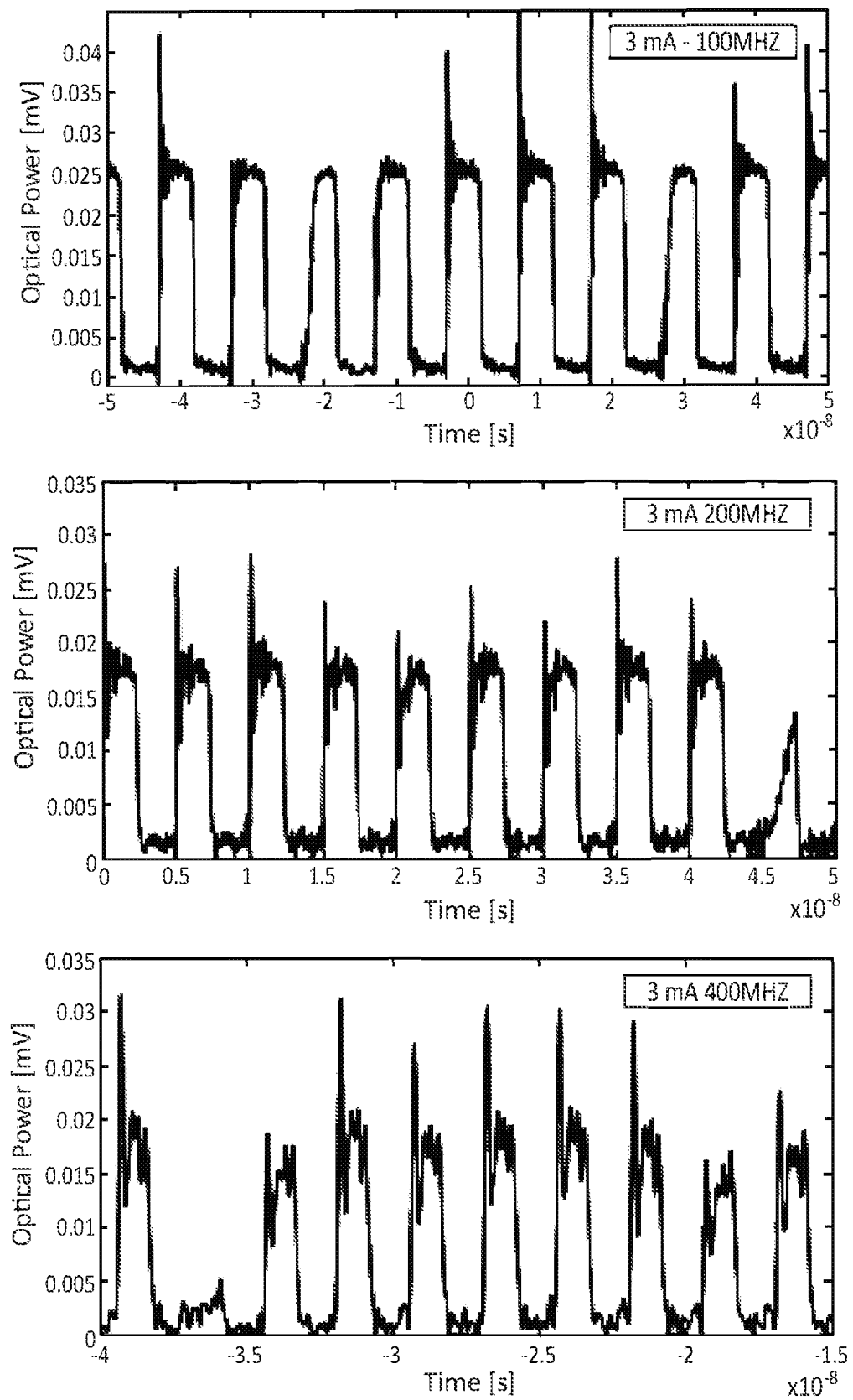
FIG. 5 is a representation of several pulses captured by an oscilloscope.

The generated random optical intensity pattern has a typical distribution as shown in FIG. 4. The time dependent trace of several pulses (right) captured by the oscilloscope together with their statistical distribution of the intensity (left) can be seen in this graph. The statistical distribution corresponds to more than 30000 pulses. Pulse/modulation frequency is 1 GHz, bias current of 1.7 mA and modulating current varies from about −2 mA to +2 mA. Note that the time dependent behaviour of the random intensity and the corresponding distribution may depend on parameters such as geometry and materials of VCSEL structure, bias current, modulating current, pulse/modulation frequency, temperature, etc. For example, there is a clear increase in the entropy at higher frequency, which is evident when going from 100 to 400 MHz (FIG. 5) and even more at 1 GHz (FIG. 4). This is due to the fact that the shorter the current pulse the lower the growth experienced by the light pulse; i.e. there is not sufficient time for the light pulse to grow to significant intensities within its duration when the random effect occurs. In FIG. 5, the time dependent trace of several pulses captured by the oscilloscope is shown. Pulse/modulation frequency is 100 MHz (top), 200 MHz (middle) and 400 MHz (bottom), the bias current is 3 mA and the modulating current varies from about −2 mA to +2 mA.

The gain-switching mechanism is used to modulate the output of the laser source. By injecting electrical carriers into the active region, through the application of an electrical signal, the gain of the laser can be changed. In particular, by setting the biasing current point of the laser below a threshold level and adding an additional modulating current, a sequence of optical pulses can be produced. During the pulse generation the laser continuously goes from below to above threshold. While doing this, a secondary lobe appears in the laser spectrum. The produced train of optical pulses undergoes strong amplitude variations due to the presence of this new spectral feature. The optical pulses are then recorded with a photodetector that converts the optical signal into an electrical signal. Finally, the electronic signal can be converted into a digital signal by means of a digitisation process, which can include high-resolution digitisers, e.g. 8 bit digitisers, or a simple comparator acting as a 1-bit resolution digitiser.

Changes and modifications in the specifically-described embodiments may be carried out without departing from the principles of the present invention, which is intended to be limited only by the scope of the appended claims as interpreted according to the principles of patent law including the doctrine of equivalents.

The invention claimed is:

1. A method comprising:
periodically modulating a gain of a vertical-cavity surface emitting laser from below a spontaneous emission threshold of the vertical-cavity surface emitting laser to above the spontaneous emission threshold of the vertical-cavity surface emitting laser;
obtaining an output of optical pulses from the vertical-cavity surface emitting laser, wherein an optical power spectral distribution of the output comprises a spectrum distribution with a predominant lobe at a first wavelength and a side lobe at a second wavelength; and
determining a series of random numbers from a difference between an optical power of the predominant lobe and an optical power of the side lobe.

2. The method of claim 1, wherein determining the series of random numbers comprises converting the output of optical pulses into electrical analog pulses;
and digitizing the electrical analog pulses into the series of random numbers;
digitizing the electrical analog pulses into the series of random numbers.

3. The method of claim 1, wherein obtaining the output comprises detecting optical pulses at a photodiode.

4. The method of claim 3, wherein the photodiode comprises a PIN photodiode.

5. The method of claim 1, wherein periodically modulating the gain of the vertical-cavity surface emitting laser comprises modulating the gain with a modulating current that varies from −2 mA to +2 mA.

6. The method of claim 1, wherein periodically modulating the gain of the vertical-cavity surface emitting laser comprises providing a biasing current to the vertical-cavity surface emitting laser that is below the spontaneous emission threshold and adding additional modulating current to the vertical-cavity surface emitting laser.

7. An apparatus comprising:
a vertical-cavity surface emitting laser;
a current source configured to periodically modulate a gain of the vertical-cavity surface emitting laser from below a spontaneous emission threshold of the vertical-cavity surface emitting laser to above the spontaneous emission threshold of the vertical-cavity surface emitting laser;
a photodiode configured to obtain an output of optical pulses from the vertical-cavity surface emitting laser, wherein an optical power spectral distribution of the output comprises a spectrum distribution with a predominant lobe at a first wavelength and a side lobe at a second wavelength; and
a digitizer a configured to determine a series of random numbers from a difference between an optical power of the predominant lobe and an optical power of the side lobe.

8. The apparatus of claim 7, wherein the digitizer is configured to determine the series of random numbers by converting the output of optical pulses into electrical analog pulses and digitizing the electrical analog pulses into the series of random numbers.

9. The apparatus of claim 7, wherein the photodiode comprises a PIN photodiode.

10. The apparatus of claim 7, wherein the current source is configured to periodically modulate the gain of the vertical-cavity surface emitting laser by modulating the gain with a modulating current that varies from −2 mA to +2 mA.

11. The apparatus of claim 7, wherein the current source is configured to periodically modulate the gain of the vertical-cavity surface emitting laser by providing a biasing current to the vertical-cavity surface emitting laser that is below the spontaneous emission threshold and adding additional modulating current to the vertical-cavity surface emitting laser.

* * * * *